(12) United States Patent
Oh (10) Patent No.: US 8,324,034 B2
(45) Date of Patent: Dec. 4, 2012

(54) METHOD OF MANUFACTURING DISPLAY DEVICE

(75) Inventor: Hyun-Uk Oh, Yongin (KR)

(73) Assignee: Samsung Display Co., Ltd. (KR)

( * ) Notice: Subject to any disclaimer, the term of this patent is extended or adjusted under 35 U.S.C. 154(b) by 180 days.

(21) Appl. No.: 12/856,819

(22) Filed: Aug. 16, 2010

(65) Prior Publication Data

US 2011/0151600 A1    Jun. 23, 2011

(30) Foreign Application Priority Data

Dec. 18, 2009  (KR) .................. 10-2009-0127272

(51) Int. Cl.
    *H01L 21/336*    (2006.01)
(52) U.S. Cl. ........ 438/163; 438/149; 438/154; 438/155; 257/E21.633
(58) Field of Classification Search .................. 438/149, 438/154–155, 162–164; 257/E21.633
    See application file for complete search history.

(56) References Cited

U.S. PATENT DOCUMENTS

| 8,143,625 B2 * | 3/2012 | Yamazaki et al. | ............... 257/72 |
| 2004/0090562 A1 | 5/2004 | Song et al. | |

FOREIGN PATENT DOCUMENTS

| KR | 10-2004-0040682 A | 5/2004 |
| KR | 10-2004-0106794 A | 12/2004 |
| KR | 10-2006-0060462 A | 6/2006 |
| KR | 10-2007-0027795 A | 3/2007 |

OTHER PUBLICATIONS

Korean Office Action dated Nov. 4, 2011, 2 pages.
Office Action dated Apr. 13, 2011 in corresponding Korean priority application No. 10-2009-0127272.

* cited by examiner

*Primary Examiner* — Thanhha Pham
(74) *Attorney, Agent, or Firm* — Knobbe Martens Olson & Bear LLP (57) ABSTRACT

In a method of manufacturing a display device, a first insulating layer is formed on a semiconductor pattern. Ions of a first concentration are injected into source and drain domains of the semiconductor pattern and a lower electrode of the semiconductor pattern by using a mask pattern that selectively overlaps a channel domain of the semiconductor pattern and is positioned on the top of the first insulating layer. The mask pattern is removed. An ion injection process of injecting ions of a second concentration lower than the first concentration into the semiconductor pattern of the channel domain is directly performed in the first insulating layer. A gate electrode that overlaps the channel domain is formed on the top of the first insulating layer. An upper electrode that overlaps the lower electrode is formed on the top of the first insulating layer.

11 Claims, 5 Drawing Sheets

METHOD OF MANUFACTURING DISPLAY DEVICE

CROSS-REFERENCE TO RELATED APPLICATIONS

This application claims the benefit of Korean Application No. 10-2009-0127272, filed Dec. 18, 2009 in the Korean Intellectual Property Office, the disclosure of which is incorporated herein by reference.

BACKGROUND OF THE INVENTION

1. Field of the Invention

Embodiments of the present invention relate to a method of manufacturing a display device, and more particularly, to a method of manufacturing a display device capable of implementing an image such as a character or a picture image.

2. Description of the Related Art

A display device of an active matrix type includes a thin film transistor for transmitting a signal and a capacitor for holding the signal. Therefore, in order to manufacture the display device of the active matrix type, mask and process operations for manufacturing the thin film transistor and the capacitor are further required. For example, a mask for forming an active layer of the thin film transistor and the lower electrode of the capacitor, a mask for forming a gate electrode of the thin film transistor and the upper electrode of the capacitor, a mask for exposing source and drain domains, and a mask for forming a source electrode and a drain electrode are required. As a result, the manufacturing cost of the group of masks increases and the manufacturing cost also increases due to the decrease of yield caused by an added process operation.

Further, in order to increase the conductivity of the lower electrode (semiconductor) of the capacitor applied with low voltage as a display device of a charged coupled driving type is introduced for low-voltage (low power consumption) driving, a mask should further be added as injection of high-concentration ions is required. Further, since the leakage current of the thin film transistor should be minimized in order to increase luminance and resolution, as a process of injecting the ions into a channel domain is required to control threshold voltage, a mask for that should further be added. Accordingly, there is a tendency for the manufacturing cost to be further increased due to an increase in the number of masks and the addition of the process operations (photolithography process, ion-injection process, removing process, etc.).

SUMMARY OF THE INVENTION

Embodiments of the present invention provide a method of manufacturing a display device capable of reducing the number of masks used in a manufacturing process. Embodiments of the present invention also provide a method of manufacturing a display device capable of improving yield by eliminating a process operation.

According to an embodiment of the present invention, a semiconductor pattern is formed on a substrate. A first insulating layer is formed on the semiconductor pattern. Ions of a first concentration are injected into source and drain domains of the semiconductor pattern and a lower electrode of the semiconductor pattern by using a mask pattern that selectively overlaps a channel domain of the semiconductor pattern and is positioned on the top of the first insulating layer. The mask pattern is removed. An ion injection process of injecting ions of a second concentration lower than the first concentration into the semiconductor pattern of the channel domain is directly performed in the first insulating layer. A gate electrode that overlaps the channel domain is formed on the top of the first insulating layer. An upper electrode that overlaps the lower electrode is formed on the top of the first insulating layer.

According to another embodiment of the present invention, in order to manufacture a display device, a semiconductor layer to be subsequently formed as a semiconductor pattern, which includes a source domain, a channel domain, and a drain domain and a lower electrode following, is formed on a substrate. A photosensitive film where thicknesses of parts corresponding to the source and drain domains and the lower electrodes are less than the thickness corresponding to the channel domain is formed on the semiconductor layer. The photosensitive film and the semiconductor layer are changed to a mask pattern and the semiconductor pattern that overlaps the channel domain, respectively, by etching back the photosensitive film and the semiconductor layer. Ions of a first concentration are injected into the source domain, the drain domain, and the lower electrode by using the mask pattern as an ion injection mask. The mask pattern is removed. Ions of a second concentration lower than the first concentration are injected into an overall surface of the semiconductor pattern. A first insulating layer is formed on the semiconductor pattern. A gate electrode that overlaps the channel domain is formed on the top of the first insulating layer. An upper electrode that overlaps the lower electrode is formed on the top of the first insulating layer.

According to yet another embodiment of the present invention, a semiconductor layer to be subsequently formed as a semiconductor pattern, which includes a source domain, a channel domain, and a drain domain and a lower electrode, is formed on a substrate. A photosensitive film where thicknesses of parts corresponding to the source and drain domains and the lower electrodes are less than the thickness corresponding to the channel domain is formed on the semiconductor layer. The photosensitive film and the semiconductor layer are changed to a mask pattern and the semiconductor pattern that overlaps the channel domain, respectively, by etching back the photosensitive film and the semiconductor layer. Ions of a first concentration are injected into the source domain, the drain domain, and the lower electrode by using the mask pattern as an ion injection mask. The mask pattern is removed. A first insulating layer is formed on the semiconductor pattern. Ions of a second concentration lower than the first concentration are injected into an overall surface of the semiconductor pattern by directly performing the ion injection process on the first insulating layer. A gate electrode that overlaps the channel domain is formed on the top of the first insulating layer. An upper electrode that overlaps the lower electrode is formed on the top of the first insulating layer.

According to embodiments of the present invention, a mask is not used in injection of low-concentration ions by using characteristics where the specific resistance is not changed even though the low-concentration ions are injected into a semiconductor pattern into which high-concentration ions are injected, such that two ion injection processes using two masks may be changed to two ion injection processes using one mask. Accordingly, the manufacturing cost may decrease and the yield may increase by reducing the number of masks and process operations that are used in the manufacturing process.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals refer to like elements.

Hereinafter, embodiments of a display device and a method of manufacturing the same will be described with reference to the accompanying drawings. Herein: i) Shapes, sizes, ratios, angles, numbers, operations, etc. shown in the accompanying drawings are schematic and may be partially modified; ii) Since the drawings are illustrated by an observer's eyes, the direction or position used to illustrate the drawings may variously be changed depending on the position of the observer; iii) When words like 'include', etc. are used, another part may be added as long as a limiting word like 'only' is not used; iv) When an element is described in the singular, it may also be interpreted as the plural number; v) Even if comparisons, positional relationships, etc. of the numerical values, sizes, and shapes are not described by 'approximately', they are interpreted to include a typical error range; vi) Although terms such as 'after', 'in addition', 'herein', 'subsequently', etc. are used, they are not used in a meaning defining a temporal position; vii) Terms such as 'first', 'second', etc. are selectively, replaceably, or repetitively for convenience of simple classification and description and should not be interpreted as a limited meaning; and viii) When the positional relationship between two parts is described by 'formed', 'disposed on", 'on', 'above', etc., one or more other parts may be interposed between the two parts as long as a limiting word like 'just' is not used. Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 1A:
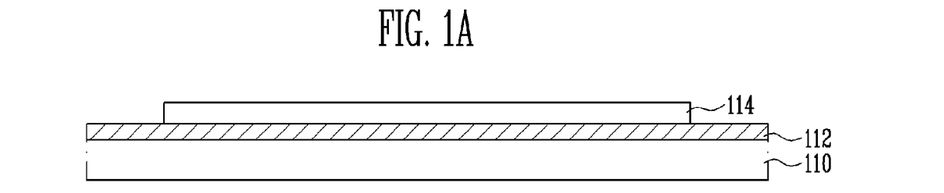
FIGS. 1A through 1F are cross-sectional views for describing a method of manufacturing a display device according to an embodiment of the present invention.

FIGS. 1A through 1F are cross-sectional views for describing a method of manufacturing a display device according to an embodiment of the present invention. Referring to FIG. 1A, a buffer layer 112 is formed on a substrate 110 containing an insulating material such as glass or plastic. A source domain, a drain domain, and a channel domain of a thin film transistor and a semiconductor pattern 114 to be used as a lower electrode of a capacitor are formed on the buffer layer 112. An active layer providing the source domain, the drain domain, and the channel domain of the thin film transistor and the lower electrode of the capacitor may integrally be formed to be connected with each other or may be formed to be spaced from each other. When the active layer and the lower electrode are spaced from each other, the active layer and the lower electrode may be spaced from each other in a process of etching a semiconductor layer (not shown) in the semiconductor pattern 114. For convenience of description, a case where the active layer of the thin film transistor and the lower electrode of the capacitor are integrally formed is illustrated in the drawings.

The buffer layer 112 for preventing impurities from being dispersed from the substrate 110 is made of a silicon oxide film ($SiO_2$) or silicon nitride film ($Si_3N_4$) and the semiconductor pattern 114 to be used as the source domain, the drain domain, and the channel domain and the lower electrode is made of amorphous silicon, polysilicon, low-temperature polysilicon, microcrystalline silicon, etc.

Figure 1B:
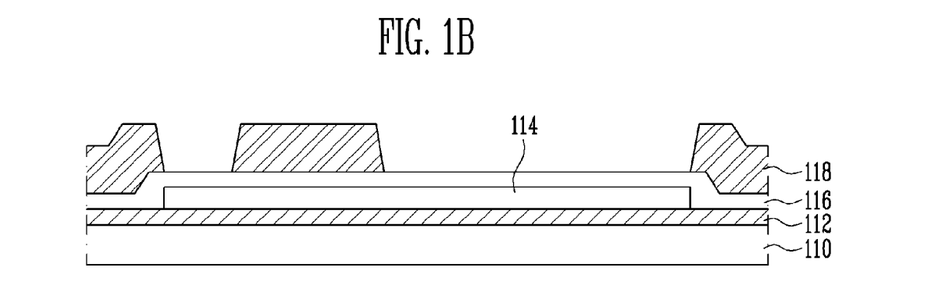

Referring to FIG. 1B, a gate insulating layer of the thin film transistor and a first insulating layer 116 to be used as a dielectric of the capacitor are formed on the buffer layer 112 where the semiconductor pattern 114 is formed. The first insulating layer 116 is formed by a silicon oxide film or a tetraethyl orthosilicate (TEOS) film.

A photosensitive film is formed on the first insulating layer 116 and, thereafter, a mask pattern 118 is formed on the first insulating layer 116 to overlap the semiconductor pattern 114 of the channel domain by performing a photolithography process including exposure and development. The semiconductor pattern 114 of the channel domain is not exposed by the mask pattern 118 and only the semiconductor pattern 114 of the source and drain domains and the lower electrode are exposed.

Figure 1C:
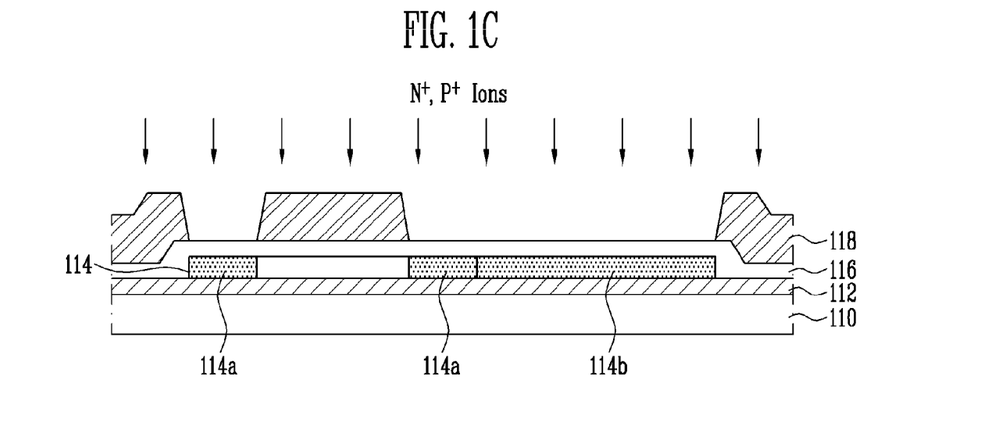

Referring to FIG. 1C, ions of a first concentration are injected into the semiconductor pattern 114 by using the mask pattern 118 as an ion injection mask. Herein, the ions of the first concentration are injected into the semiconductor pattern 114 through the first insulating layer 116.

The first concentration is a high concentration of approximately $10^{15}$ atoms/$cm^3$, source and drain domains 114a are formed in the semiconductor pattern 114 of the active layer by injection of N+-type or P+-type high-concentration ions, and the semiconductor pattern 114 of the lower electrode has specific resistance enough to be used as a lower electrode 114b. As described above, the drain domains 114a and lower electrode 114b are parts of the semiconductor pattern 114.

Herein, the N-type ions may be nitrogen (N), phosphorus (P), arsenic (As), antimony (Sb), bismuth (Bi), etc. They may be used singly or in a combination thereof. P-type ions may be boron (B), aluminum (Al), gallium (Ga), indium (In), titanium (Ti), etc. They may be used singly or in a combination thereof.

Figure 1D:
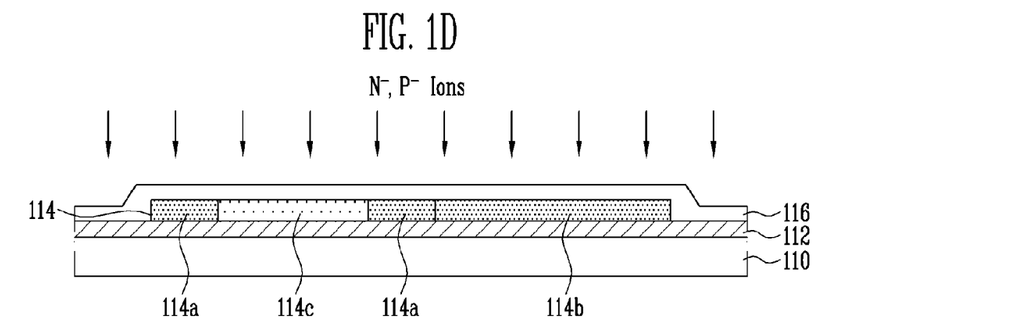

Referring to FIG. 1D, the mask pattern 118 is removed. In addition, ions of a second concentration lower than the first concentration are injected into an overall surface of the semiconductor pattern 114 without using an additional mask. The second concentration is a low concentration of approximately $10^{12}$ atoms/$cm^3$ and a channel domain 114c is formed in the semiconductor pattern 114 between the source and drain domains 114a by injection of N-type or P-type low-concentration ions. At this time, although the ions of the second concentration are injected into even the source and drain domains 114a and the lower electrode 114b, the specific resistance (carrier concentration) of the source and drain domains 114a and the lower electrode 114b is not changed by injection of the ions of the second concentration lower than the first concentration.

Further, the kind of ions injected by removing the mask pattern 118 is different from ions injected by using the mask pattern 118 as an ion injection mask. In the case where the ions injected by using the mask pattern 118 as the ion injection mask are a P type, the kind of the ions injected by removing the mask pattern 118 may be an N type and in this case, a positive-channel metal oxide semiconductor (PMOS) is formed. Conversely, in the case where the ions injected by using the mask pattern 118 as the ion injection mask are the N type, the kind of the ions injected by removing the mask pattern 118 may be the P type and in this case, a negative-channel metal oxide semiconductor (NMOS) is formed.

Figure 1E:
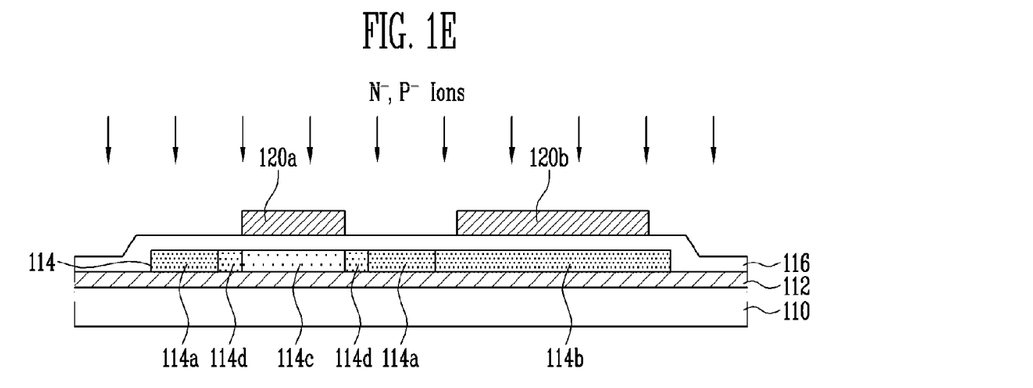

Referring to FIG. 1E, a gate electrode 120a is formed on the first insulating layer 116 of the channel domain 114c by forming and patterning a conductive layer on the first insulating layer 116 and an upper electrode 120b is formed on the first insulating layer 116 on the top of the lower electrode 114b. Herein, although the gate electrode 120a and the lower electrode 114b are formed on the same layer through the same process, the gate electrode 120a and the lower electrode 114b may be similarly formed on different layers through different processes. As described above, the channel domain 144c is part of the semiconductor pattern 114.

The conductive layer is formed by tungsten (W), titanium (Ti), molybdenum (Mo), silver (Ag), tantalum (Ta), aluminum (Al), copper (Cu), gold (Au), chrome (Cr), niobium (Nb) or an alloy thereof. They may be used singly or in a combination thereof.

Ions of a third concentration lower than the first concentration and higher than the second concentration are injected into the semiconductor pattern 114 covered with the first insulating layer 116 by using the gate electrode 120a as the ion injection mask. The third concentration is a low concentration of approximately $10^{13}$ atoms/cm$^3$ and, for example, a lightly doped drain domain (LDD) 114d is formed in the channel domain 114c at both sides of the gate electrode 120a by injection of the N-type or P-type third-concentration ions using the gate electrode 120a as the ion injection mask. At this time, although the ions of the third concentration are injected into even the drain domain 114a and the lower electrode 114b, the specific resistance (carrier concentration) of the source and drain domains 114a is not changed by injection of the ions of the third concentration lower than the first concentration. The injection process of the ions of the third concentration for forming the LDD domain 114d may be omitted as necessary. As described above, the LDD domain 114d is part of the semiconductor pattern 114.

The kind of the ions injected by using the gate electrode 120a as the ion injection mask is substantially the same as the kind of ions injected by using the mask pattern 118 as the ion injection mask. That is, in the case where the kind of the ions injected by using the gate electrode 120a as the ion injection mask is the P type, the kind of the ions injected by using the mask pattern 118 as the ion injection mask may be the P type. Conversely, in the case where the kind of the ions injected by using the gate electrode 120a as the ion injection mask is the N type, the kind of the ions injected by using the mask pattern 118 as the ion injection mask may also be the N type.

Figure 1F:
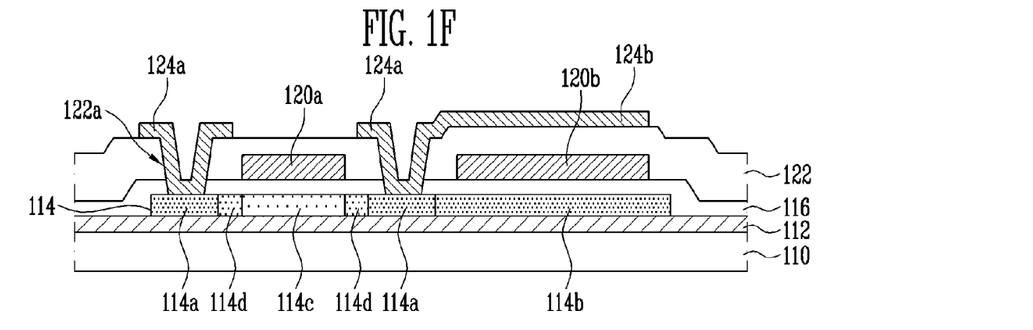

Referring to FIG. 1F, a second insulating layer 122 is formed on the first insulating layer 116 including the gate electrode 120a and an upper electrode 120b. At least one contact hole 122a is formed to expose the source and drain domains 114a by patterning the second insulating layer 122 and the first insulating layer 116. In addition, source and drain electrodes 124a connected with the source and drain domains 114a through the contact hole and a pixel electrode 124b connected with the source or drain electrode 124a are formed by forming and patterning the conductive layer on the second insulating layer 122 to bury the contact hole 122a. The conductive layer is formed by a transparent conductive material such as indium tin oxide (ITO) or indium zinc oxide (IZO).

Figure 2A:
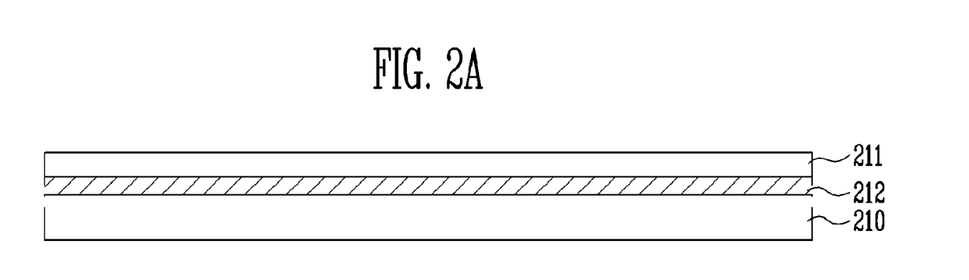
FIGS. 2A through 2H are cross-sectional views for describing a method of manufacturing a display device according to another embodiment of the present invention.

FIGS. 2A through 2H are cross-sectional views for describing a method of manufacturing a display device according to another embodiment of the present invention. Referring to FIG. 2A, a buffer layer 212 is formed on a substrate 210 including an insulating material such as glass or plastic and a semiconductor layer 211 to be subsequently formed as a semiconductor pattern 214 (see FIGS. 2C through 2H) including the source domain, the drain domain, and the channel domain of the thin film transistor and the lower electrode of the capacitor is formed on the buffer layer 212.

The buffer layer 212 for preventing impurities from being dispersed from the substrate 210 is formed by a silicon oxide film (SiO$_2$) or a silicon nitride film (Si$_3$N$_4$) and the semiconductor layer 211 is formed by amorphous silicon, polysilicon, low-temperature polysilicon, or microcrystalline silicon.

Figure 2B:
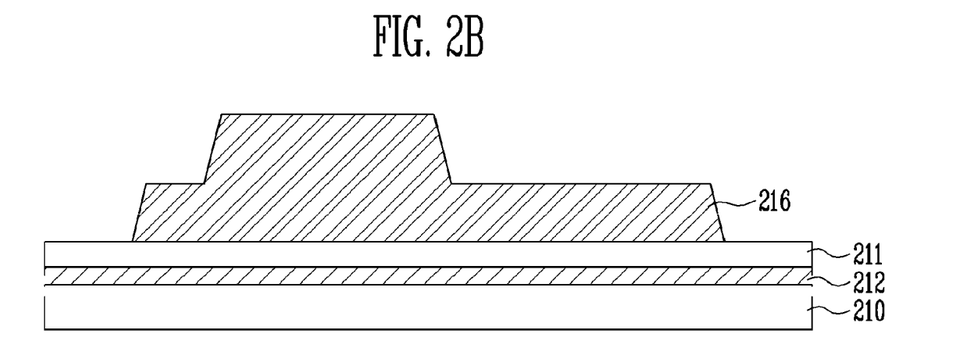

Referring to FIG. 2B, a photosensitive film 216 having a predetermined thickness is formed on the semiconductor layer 211 and the photosensitive film 216 is patterned so as to reduce the thickness of the photosensitive film 216 of the source and drain domains and the lower electrode part by performing the photolithography process including the exposure and development. For example, it is possible to pattern the photosensitive film 216 so as to make the thickness of the photosensitive film 216 of the source and drain domains and the lower electrode larger than the thickness of the photosensitive film 216 of the channel domain by using a half tone mask.

Figure 2C:
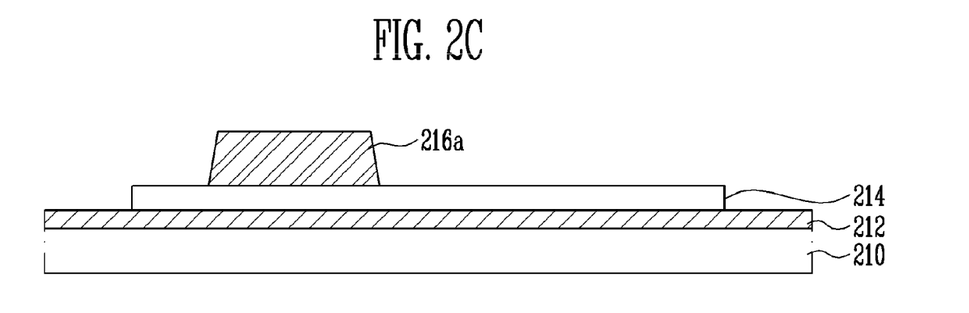

Referring to FIG. 2C, the semiconductor pattern 214 is formed by patterning the semiconductor layer 211 by etching back the photosensitive film 216 and a mask pattern 216a is formed on the semiconductor pattern 214 of the channel domain. As the photosensitive film 216 of the source and drain domains and the lower electrode that are comparatively thinner is etched, the semiconductor layer 211 is patterned and the mask pattern 216a remains on the semiconductor pattern 214 of the channel domain.

As shown in the figure, the semiconductor pattern 214 may integrally include an active layer providing the source domain, the drain domain, and the channel domain of the thin film transistor and the lower electrode of the capacitor that are connected with each other. In another embodiment, the active layer and the lower electrode of the capacitor may be spaced from each other and in this case, they may be spaced from each other by the above-mentioned etch-back process.

Figure 2D:
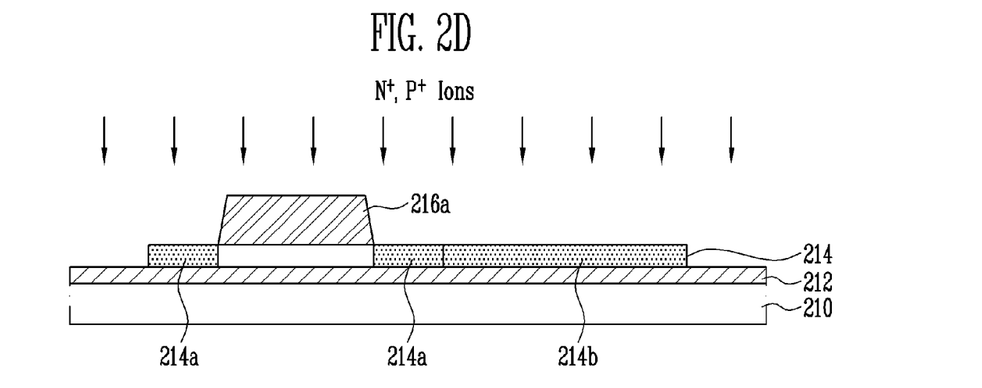

Referring to FIG. 2D, the ions of the first concentration are injected into the semiconductor pattern 214 by using the mask pattern 216a as a mask. The first concentration is a high concentration of approximately $10^{15}$ atoms/cm$^3$, source and drain domains 214a are formed in the semiconductor pattern 214 of the active layer by injection of N+-type or P+-type high-concentration ions, and the semiconductor pattern 214 of the lower electrode has specific resistance enough to be used as a lower electrode 214b. As described above, the drain domains 214a and lower electrode 214b are parts of the semiconductor pattern 214.

Figure 2E:
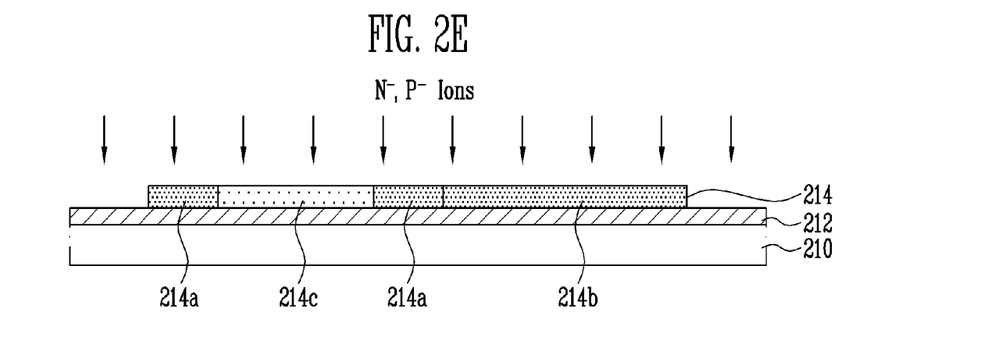

Referring to FIG. 2E, the mask pattern 216a is removed. In addition, ions of a second concentration lower than the first concentration are injected into an overall surface of the semiconductor pattern 214 without using an additional mask. The second concentration is a low concentration of approximately $10^{12}$ atoms/cm$^3$ and a channel domain 214c is formed in the semiconductor pattern 214 between the source and drain domains 214a by injection of N-type or P-type low-concentration ions. At this time, although the ions of the second concentration are injected into even the source and drain domains 214a and the lower electrode 214b, the specific resistance (carrier concentration) of the source and drain domains 214a and the lower electrode 214b is not changed by injection of the ions of the second concentration lower than the first concentration. As described above, the channel domain 214c is part of the semiconductor pattern 214.

Figure 2F:
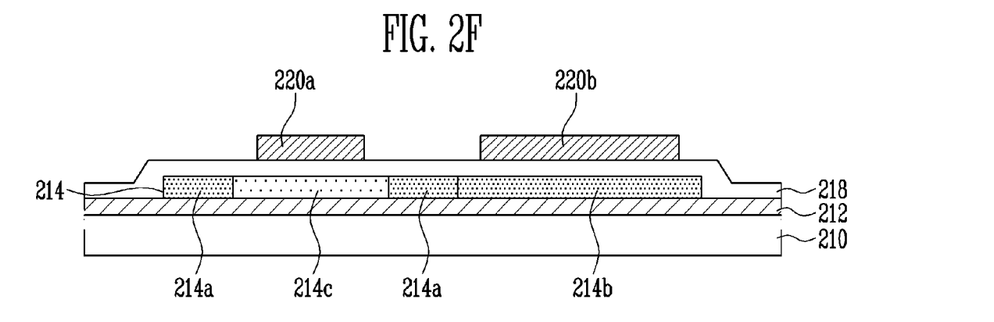

Referring to FIG. 2F, the gate insulating layer of the thin film transistor and a first insulating layer 218 to be used as the dielectric of the capacitor are formed on the buffer layer 212 including the semiconductor pattern 214. The first insulating layer 218 is formed by a silicon oxide film or a tetraethylorthosilicate (TEOS) oxide film.

As described above, the first insulating layer 218 may be formed after injection of impurities of the first concentration and the second concentration is terminated. In another embodiment, the first insulating layer 218 may be formed before the impurities of the first concentration and the second concentration are injected.

Specifically, the first insulating layer 218 may be formed before the impurities of the second concentration are injected after the mask pattern 216a is removed and, in this case, it is possible to reduce damage of the semiconductor pattern 214 caused due to the injection of the impurities of the second concentration.

A gate electrode 220a is formed on the first insulating layer 218 of the channel domain 214c by forming and patterning the conductive layer on the first insulating layer 218 and an upper electrode 220b is formed on the first insulating layer 218 above the lower electrode 214b. The conductive layer may include tungsten (W), titanium (Ti), molybdenum (Mo), silver (Ag), tantalum (Ta), aluminum (Al), copper (Cu), gold (Au), chrome (Cr), niobium (Nb) or an alloy thereof. They may be used singly or in a combination thereof. Herein, the gate electrode 220a and the upper electrode 220b may be formed on different layers by different processes.

Figure 2G:
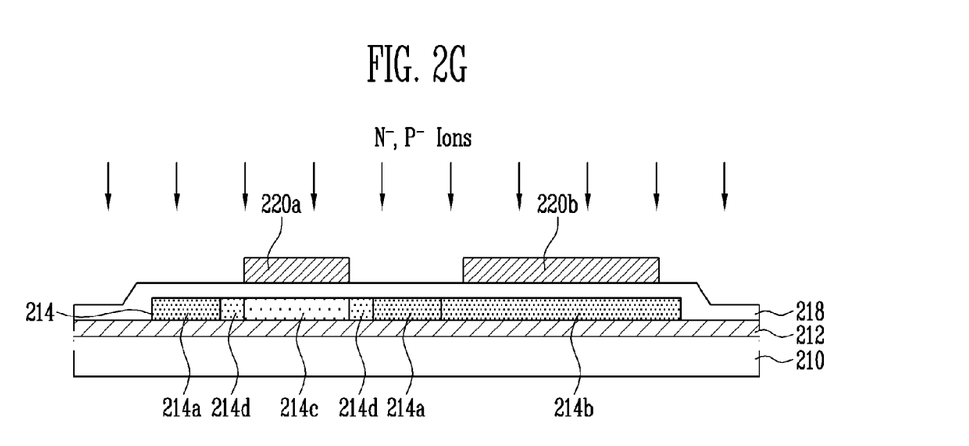

Referring to FIG. 2G, the ions of a third concentration lower than the first concentration and higher than the second concentration are injected into the overall surface of the semiconductor pattern 214 by using the gate electrode 220a as the ion injection mask. The third concentration is a low concentration of approximately $10^{13}$ atoms/cm$^3$ and, for example, an LDD 214d is formed in the channel domain 214c at both sides of the gate electrode 220a by injection of the N-type or P-type low-concentration ions using the gate electrode 220a as the ion injection mask. At this time, although the ions of the third concentration are injected into even the source and drain domains 214a, the specific resistance (carrier concentration) of the source and drain domains 214a is not changed by injection of the ions of the third concentration lower than the first concentration. The injection process of the ions of the third concentration for forming the LDD domain 214d may be omitted as necessary. As described above, the LDD domain 214d is part of the semiconductor pattern 114.

Figure 2H:
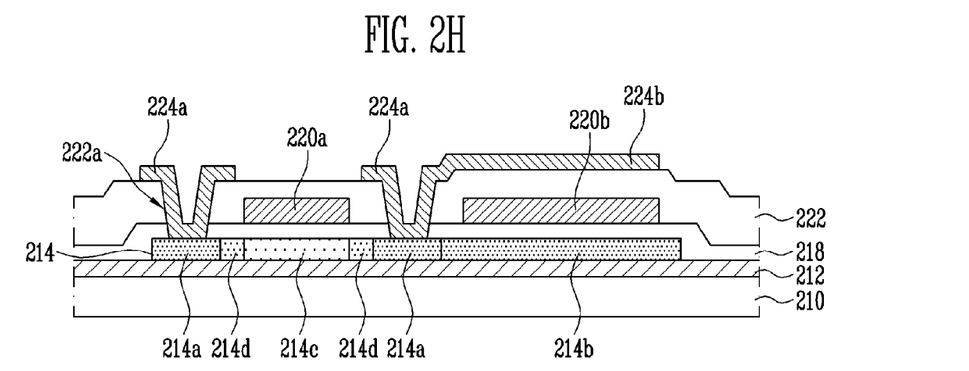

Referring to FIG. 2H, a second insulating layer 222 is formed on the first insulating layer 218 including the gate electrode 220a and the upper electrode 220b. At least one contact hole 222a is formed to expose the source and drain domains 214a by patterning the second insulating layer 222 and the first insulating layer 218. In addition, source and drain electrodes 224a connected with the source and drain domains 214a through the contact hole and a pixel electrode 224b connected with the source or drain electrode 224a are formed by forming and patterning the conductive layer on the second insulating layer 222 to bury the contact hole 222a. The conductive layer is formed by the transparent conductive material or metal such as ITO or IZO.

When the processes of FIGS. 1A through 1F or the processes of FIGS. 2A through 2H are completed, a substrate where a common electrode is formed to oppose the pixel electrodes 124b and 224b is disposed on the substrates 110 and 210, a liquid crystal display device is manufactured by injecting a liquid crystal layer into a space sealed between two substrates in the state where the two substrates are spaced from each other by a predetermined gap by a spacer, a pixel defining film is formed on the second insulating layer 222 including the pixel electrodes 124b and 224b so as to expose the pixel electrodes 124b and 224b of a light emitting domain, and an organic light emitting layer and a cathode electrode are formed on the exposed pixel electrodes 124b and 224b to manufacture an organic light emitting display device.

Two masks and two ion injection processes are required in order to form the source and drain domains on the semiconductor active layer. However, in the embodiments of the present invention, the source and drain domains 114a and 214a of the thin film transistor and the lower electrode 114b of the capacitor are formed by injecting the ions of high concentration and thereafter, the ions of low concentration are injected to form the channel domains 114c and 214c of the thin film transistor. A mask is not used in injection of low-concentration ions by using the properties that specific resistance is not changed even though the low-concentration ions are injected into a semiconductor pattern into which high-concentration ions are injected, such that two ion injection processes using two masks may be changed to the two ion injection processes using one mask. Accordingly, the manufacturing cost may decrease and the yield may increase by reducing the number of masks and process operations that are used in the manufacturing process.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a display device, comprising:
   forming a semiconductor pattern on a substrate;
   forming a first insulating layer on the semiconductor pattern;
   injecting ions of a first concentration into source and drain domains of the semiconductor pattern and a lower electrode of the semiconductor pattern by using a mask pattern that selectively overlaps a channel domain of the semiconductor pattern and is positioned on the top of the first insulating layer;
   removing the mask pattern;
   directly performing an ion injection process of injecting ions of a second concentration lower than the first concentration into the semiconductor pattern of the channel domain in the first insulating layer;
   forming a gate electrode that overlaps the channel domain on the top of the first insulating layer; and
   forming an upper electrode that overlaps the lower electrode on the top of the first insulating layer.

2. The method of manufacturing a display device of claim 1, wherein the ion injection process is performed directly on the semiconductor pattern.

3. The method of manufacturing a display device of claim 1, wherein the lower electrode is connected to one of the source and drain domains.

4. The method of manufacturing a display device of claim 1, wherein forming the semiconductor pattern further includes patterning the semiconductor pattern so that the channel domain, source, and drain domains and the lower electrode are spaced from each other.

5. The method of manufacturing a display device of claim 1, further comprising:
   forming a lightly doped drain domain (LDD) by injecting ions of a third concentration lower than the first concentration and higher than the second concentration into the semiconductor pattern by using the gate electrode as an ion injection mask.

6. The method of manufacturing a display device of claim 1, further comprising:
   forming a second insulating layer on the first insulating layer including the gate electrode and the upper electrode;
   forming a contact hole to expose the semiconductor pattern of the source and drain domains by patterning the second insulating layer and the first insulating layer; and
   forming source and drain electrodes connected with the source and drain domains through the contact hole and a pixel electrode connected with the source or drain electrode.

7. The method of manufacturing a display device of claim 6, further comprising:
   forming a pixel defining film on the second insulating layer including the pixel electrode;
   exposing the pixel electrode of a light emitting domain by patterning the pixel defining film;
   forming an organic light emitting layer on the exposed pixel electrode; and
   forming a cathode electrode on the organic light emitting layer.

8. The method of manufacturing a display device of claim 1, wherein forming the semiconductor pattern further includes patterning the semiconductor pattern so that the channel domain, source, and drain domains and the lower electrode are integrally formed.

9. The method of manufacturing a display device of claim 7, further comprising: forming a second substrate with a common electrode to oppose the pixel electrodes.

10. A method of manufacturing a display device comprising a semiconductor pattern formed on a substrate, a first insulating layer formed on the semiconductor pattern, a mask pattern that selectively overlaps a channel domain of the semiconductor pattern and is positioned on top of the first insulating layer, and a plurality of ion concentrations, the method comprising:
    injecting ions of a first concentration into source and drain domains of the semiconductor pattern and a lower electrode of the semiconductor pattern by using the mask pattern such that the mask pattern selectively overlaps a channel domain of the semiconductor pattern and is positioned on the top of the first insulating layer;
    removing the mask pattern;
    directly performing an ion injection process of injecting ions of a second concentration lower than the first concentration into the semiconductor pattern of the channel domain in the first insulating layer;
    forming a gate electrode that overlaps the channel domain on the top of the first insulating layer; and
    forming an upper electrode that overlaps the lower electrode on the top of the first insulating layer.

11. The method of manufacturing a display device of claim 10, further comprising:
    forming a lightly doped drain domain (LDD) by injecting ions of a third concentration lower than the first concentration and higher than the second concentration into the semiconductor pattern by using the gate electrode as an ion injection mask.

* * * * *